US012656437B2

(12) United States Patent
Ye

(10) Patent No.: US 12,656,437 B2
(45) Date of Patent: Jun. 16, 2026

(54) SYSTEMS AND METHODS FOR MAGNETIC RESONANCE IMAGING

(71) Applicant: UNITED IMAGING HEALTHCARE NORTH AMERICA, INC., Houston, TX (US)

(72) Inventor: Yongquan Ye, Houston, TX (US)

(73) Assignee: UNITED IMAGING HEALTHCARE NORTH AMERICA, INC., Houston, TX (US)

( * ) Notice: Subject to any disclaimer, the term of this patent is extended or adjusted under 35 U.S.C. 154(b) by 317 days.

(21) Appl. No.: 18/430,594

(22) Filed: Feb. 1, 2024

(65) Prior Publication Data
US 2025/0251477 A1　Aug. 7, 2025

(51) Int. Cl.
*G01R 33/56* (2006.01)
*G01R 33/36* (2006.01)
*G01R 33/48* (2006.01)

(52) U.S. Cl.
CPC ..... *G01R 33/5608* (2013.01); *G01R 33/3607* (2013.01); *G01R 33/4828* (2013.01)

(58) Field of Classification Search
CPC ............ G01R 33/3607; G01R 33/4828; G01R 33/5608
See application file for complete search history.

(56) References Cited

U.S. PATENT DOCUMENTS

| | | | | |
|---|---|---|---|---|
| 8,035,381 | B2 * | 10/2011 | Lustig | ................ G01R 33/4828 |
| | | | | 324/309 |
| 10,578,695 | B2 * | 3/2020 | Bastiaansen | ....... G01R 33/5607 |
| 10,698,056 | B2 * | 6/2020 | Shen | .................... G01R 33/543 |

FOREIGN PATENT DOCUMENTS

| | | |
|---|---|---|
| CN | 108700638 A | 10/2018 |
| WO | 2016179264 A1 | 11/2016 |

OTHER PUBLICATIONS

Ye, Yongquan et al., Robust Selective Signal Suppression Using Binomial Off-Resonant Rectangular (BORR) Pulses, Journal of Magnetic Resonance Imaging, 39(1): 195-202, 2014.
Jessica A. M. Bastiaansen et al., Flexible Water Excitation for Fat-Free MRI at 3T Using Lipid Insensitive Binomial Off-Resonant RF Excitation (LIBRE) Pulses, Magnetic Resonance in Medicine, 1-11, 2017.
Jessica A. M. Bastiaansen et al., Noncontrast Free-Breathing Respiratory Self-Navigated Coronary Artery Cardiovascular Magnetic Resonance Angiography at 3T Using Lipid Insensitive Binomial Off-Resonant Excitation (LIBRE), Journal of Cardiovascular Magnetic Resonance, 1-11, 2019.

(Continued)

*Primary Examiner* — Gregory H Curran
(74) *Attorney, Agent, or Firm* — METIS IP LLC

(57) ABSTRACT
The present disclosure provides methods and systems for MRI. The method may include obtaining MRI data of a target subject. The MRI data may be collected by applying an MRI pulse sequence on the target subject. The MRI pulse sequence may include a monomial RF pulse for exciting first substance in the target subject and suppressing second substance in the target subject. The method may further include reconstructing a magnetic resonance (MR) image of the target subject based on the MRI data.

20 Claims, 9 Drawing Sheets

<u>300</u>

(56) References Cited

OTHER PUBLICATIONS

Roberto Colotti et al., Simultaneous Fat-Free Isotropic 3D Anatomical Imaging and T(2) Mapping of Knee Cartilage With Lipid-Insensitive Binomial Off-Resonant RF Excitation (LIBRE) Pulses, Journal of Magnetic Resonance Imaging, 1-10, 2018.

Nemanja Masala et al., Free-Running 5D Coronary MR Angiography at 1.5T Using LIBRE Water Excitation Pulses, Magnetic Resonance in Medicine, 1-16, 2020.

Liu, Zeping et al., Water Excitation with LIBRE Pulses in Three-Dimensional Variable Flip AngleFat-Free and Large Field of View Imaging at 3 Tesla, Magnetic Resonance Imaging, 96: 17-26.

* cited by examiner

100

<u>300</u>

500

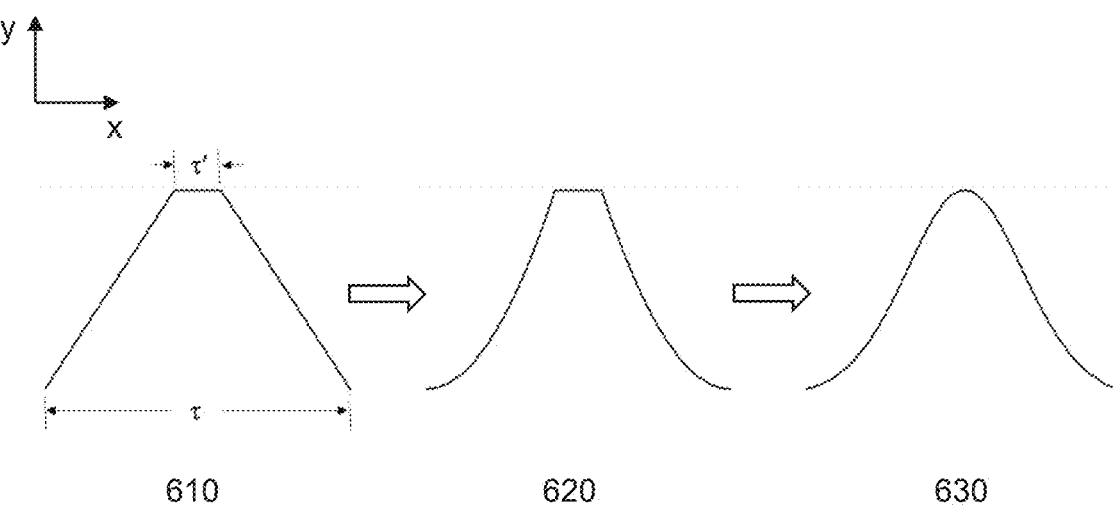

FIG. 6

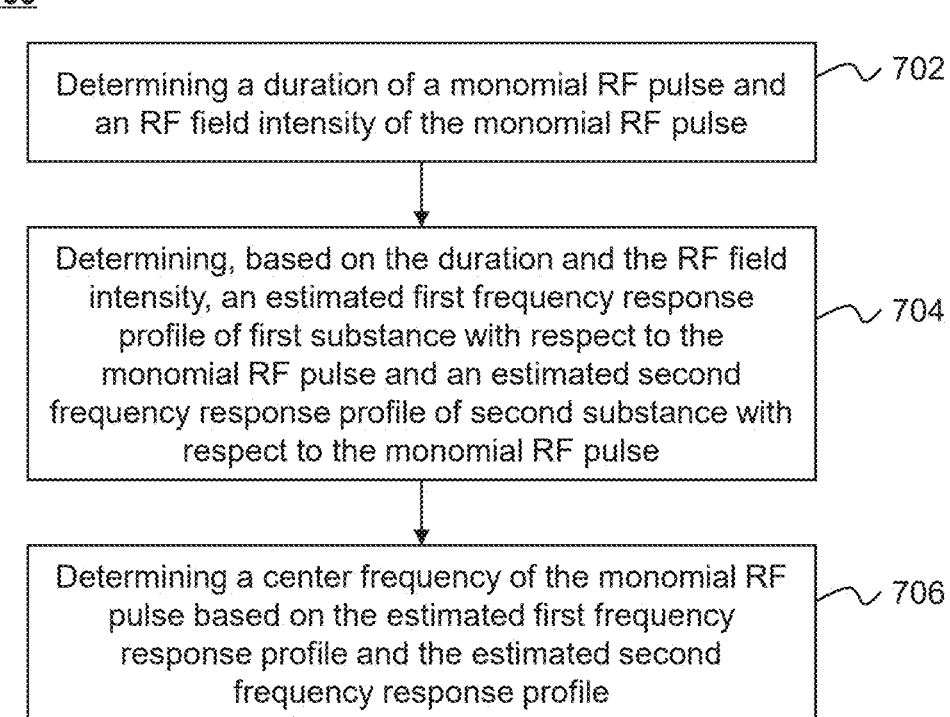

700

| 702 | Determining a duration of a monomial RF pulse and an RF field intensity of the monomial RF pulse |

| 704 | Determining, based on the duration and the RF field intensity, an estimated first frequency response profile of first substance with respect to the monomial RF pulse and an estimated second frequency response profile of second substance with respect to the monomial RF pulse |

| 706 | Determining a center frequency of the monomial RF pulse based on the estimated first frequency response profile and the estimated second frequency response profile |

| | |
|---|---|
| Determining peak width information based on a duration | 802 |
| Determining peak frequency information based on a radio field intensity | 804 |
| Determining an estimated first frequency response profile and an estimated second frequency response profile based on the peak width information and the peak frequency information | 806 |

SYSTEMS AND METHODS FOR MAGNETIC RESONANCE IMAGING

TECHNICAL FIELD

The present disclosure generally relates to the magnetic resonance imaging (MRI) field, and more particularly, relates to systems and methods for MRI using an MRI sequence that includes a Monomial radio frequency (RF) pulse with off-resonant spin tipping effects (referred to as an MOST RF pulse herein).

BACKGROUND

Magnetic resonance (MR) technology has been widely used in various fields such as physics, chemistry, biology, and medicine. In some MR scans, the RF pulse needs to be specifically designed to excite target substance (e.g., the water) in a target subject while suppress other substance (e.g., the fat, the silica gel) in the target subject. Therefore, it is desirable to provide an improved design strategy of the RF pulse for reliably exciting the target substance while reliably suppressing other substances.

SUMMARY

In an aspect of the present disclosure, a method for MRI is provided. The method may be implemented on a computing device having at least one processor and at least one storage device. The method may include obtaining MRI data of a target subject. The MRI data may be collected by applying an MRI pulse sequence on the target subject. The MRI pulse sequence may include a monomial RF pulse for exciting first substance in the target subject and suppressing second substance in the target subject. The method may further include reconstructing an MR image of the target subject based on the MRI data. A waveform of the monomial RF pulse may be determined by: generating a trapezoidal waveform; generating a preliminary waveform by performing exponential transformation on each point in the trapezoidal waveform; and determining the waveform of the monomial RF pulse by filtering the preliminary waveform.

In some embodiments, the phase of the monomial RF pulse may be a constant value during application.

In some embodiments, the trapezoidal waveform may include a top side having a first length and a bottom side having a second length, the first length may be greater than zero and smaller than the second length.

In some embodiments, a center frequency of the monomial RF pulse may be determined by: determining a duration of the monomial RF pulse and an RF field intensity of the monomial RF pulse; determining, based on the duration and the RF field intensity, an estimated first frequency response profile of the first substance with respect to the monomial RF pulse and an estimated second frequency response profile of the second substance with respect to the monomial RF pulse; and determining the center frequency of the monomial RF pulse based on the estimated first frequency response profile and the estimated second frequency response profile.

In some embodiments, the estimated first frequency response profile and the estimated second frequency response profile may be determined by: determining peak width information based on the duration; determining peak frequency information based on the RF field intensity; and determining the estimated first frequency response profile and the estimated second frequency response profile based on the peak width information and the peak frequency information.

In some embodiments, the determining peak frequency information based on the RF field intensity may include determining a threshold intensity relating to the RF field intensity, the threshold intensity corresponding to a preset equivalent flip angle; and determining the peak frequency information based on the RF field intensity and the threshold intensity.

In some embodiments, the determining the center frequency of the monomial RF pulse based on the estimated first frequency response profile and the estimated second frequency response profile may include determining one or more estimated passbands in which the first substance is excited based on the estimated first frequency response profile; determining one or more estimated stopbands in which the second substance is suppressed based on the estimated second frequency response profile; determining an estimated overlap frequency range between the one or more estimated passbands and the one or more estimated stopbands; and determining the center frequency that is within the estimated overlap frequency range.

In some embodiments, a first frequency response profile of the first substance with respect to the monomial RF pulse may include one or more passbands in which the first substance is excited, and each of the one or more passbands may span over a locally continuous frequency range. A second frequency response profile of the second substance with respect to the monomial RF pulse may include one or more stopbands in which the second substance is suppressed, and at least one stopband of the one or more stopbands may be a semi-infinite frequency range. At least one passband of the one or more passbands may have an overlap frequency range with the at least one stopband, and a center frequency of the monomial RF pulse may be within the overlap frequency range.

In some embodiments, the first substance and the second substance may be two different substances among the water, the fat, and the silica gel.

In another aspect of the present disclosure, a method for MRI is provided. The method may be implemented on a computing device having at least one processor and at least one storage device. The method may include obtaining MRI data of a target subject. The MRI data may be collected by applying an MRI pulse sequence on the target subject. The MRI pulse sequence may include a monomial RF pulse for exciting first substance in the target subject and suppressing second substance in the target subject. The method may further include reconstructing an MR image of the target subject based on the MRI data. A first frequency response profile of the first substance with respect to the monomial RF pulse may include one or more passbands in which the first substance is excited, and each of the one or more passbands may span over a locally continuous frequency range. A second frequency response profile of the second substance with respect to the monomial RF pulse may include one or more stopbands in which the second substance is suppressed, and at least one stopband of the one or more stopbands may be a semi-infinite frequency range. At least one passband of the one or more passbands may have an overlap frequency range with the at least one stopband, and a center frequency of the monomial RF pulse may be within the overlap frequency range.

In still another aspect of the present disclosure, a system for MRI is provided. The system may include at least one storage device including a set of instructions; and at least one processor configured to communicate with the at least one storage device. When executing the set of instructions, the at least one processor may be configured to direct the system to perform operations. The operations may include obtaining MRI data of a target subject. The MRI data may be collected by applying an MRI pulse sequence on the target subject. The MRI pulse sequence may include a monomial RF pulse for exciting first substance in the target subject and suppressing second substance in the target subject. The operations may further include reconstructing an MR image of the target subject based on the MRI data. A waveform of the monomial RF pulse may be determined by: generating a trapezoidal waveform; generating a preliminary waveform by performing exponential transformation on each point in the trapezoidal waveform; and determining the waveform of the monomial RF pulse by filtering the preliminary waveform.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 6 is a schematic diagram illustrating an exemplary process for determining a waveform of a monomial RF pulse according to some embodiments of the present disclosure;

FIG. 7 is a flowchart illustrating an exemplary process for determining a center frequency of a monomial RF pulse according to some embodiments of the present disclosure;

DETAILED DESCRIPTION

Figure 1:
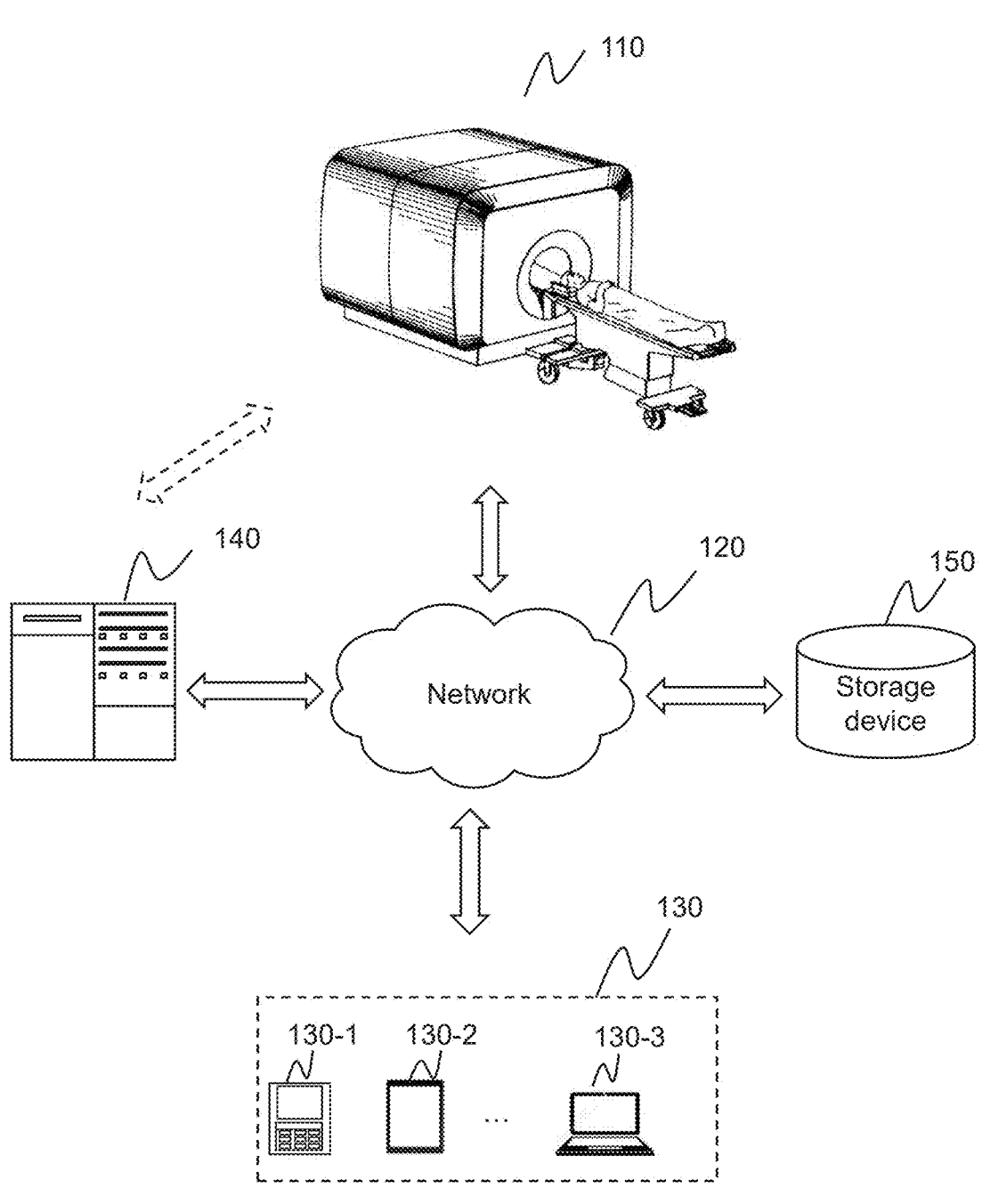
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The term "pixel" and "voxel" in the present disclosure are used interchangeably to refer to an element in an image. In the present disclosure, the term "image" may refer to a two-dimensional (2D) image, a three-dimensional (3D) image, or a four-dimensional (4D) image (e.g., a time series of 3D images). In some embodiments, the term "image" may refer to an image of a region (e.g., a region of interest (ROI)) of a subject. In some embodiment, the image may be a medical image, an optical image, etc.

In the present disclosure, a representation of a subject (e.g., an object, a patient, or a portion thereof) in an image may be referred to as "subject" for brevity. For instance, a representation of an organ, tissue (e.g., a heart, a liver, a lung), or an ROI in an image may be referred to as the organ, tissue, or ROI, for brevity. Further, an image including a representation of a subject, or a portion thereof, may be referred to as an image of the subject, or a portion thereof, or an image including the subject, or a portion thereof, for brevity. Still further, an operation performed on a representation of a subject, or a portion thereof, in an image may be referred to as an operation performed on the subject, or a portion thereof, for brevity. For instance, a segmentation of a portion of an image including a representation of an ROI from the image may be referred to as a segmentation of the ROI for brevity.

In some MR scans, the RF pulse needs to be specifically designed to excite first substance (e.g., the water) in a target subject while suppress second substance (e.g., the fat, the silica gel) in the target subject. Recently, BORR pulses and LIBRE pulses have been proposed. However, both the BORR pulses and the LIBRE pulses include two rectangular RF sub-pulses, which have certain requirements on MRI devices. In addition, a frequency range in which the second substance is suppressed is relatively small (e.g., the span of the frequency range is around 100 hertz (Hz)), which reduces the applicability of the pulses. Therefore, it is desirable to provide an improved design strategy of the RF pulse for reliably exciting the first substance while reliably suppressing other substances.

The present disclosure relates to systems and methods for MRI using an MRI pulse sequence that includes a monomial RF pulse for exciting first substance in the target subject and suppressing second substance in the target subject. The monomial RF pulse disclosed herein is referred to as a MOST pulse, and the waveform of the monomial RF pulse may be determined by generating a trapezoidal waveform; generating a preliminary waveform by performing exponential transformation on each point in the trapezoidal waveform; and determining the waveform of the monomial RF pulse by filtering the preliminary waveform. By using the specially designed monomial RF pulse disclosed herein, the first substance in the target subject can be excited effectively, and the second substance in the target subject can be suppressed effectively, which can reduce the noise and/or interference from the second substance, thereby improving the accuracy of the MRI data and/or the MR image. In addition, the specially designed monomial RF pulse is especially beneficial for applications under high fields and ultra high fields, not only showing insensitivity towards $B_0$ and $B_1$ inhomogeneity that are usually prominent in high fields, but also produces relative lower specific absorption rate (SAR) of RF energy.

In some embodiments, a first frequency response profile of the first substance with respect to the monomial RF pulse may include one or more passbands in which the first substance is excited, and each of the one or more passbands may span over a locally continuous frequency range. A second frequency response profile of the second substance with respect to the monomial RF pulse may include one or more stopbands in which the second substance is suppressed, and at least one stopband of the one or more stopbands may be a semi-infinite frequency range. At least one passband of the one or more passbands may have an overlap frequency range with the at least one stopband, and a center frequency of the monomial RF pulse may be within the overlap frequency range. Due to the semi-infinite frequency range of the at least one stopband, the whole passband of the at least one passband can be within the at least one stopband, which can improve the length of the overlap frequency range, and improve the selectivity of the center frequency of the monomial RF pulse and the applicability of the monomial RF pulse.

FIG. 1 is a schematic diagram illustrating an exemplary MRI system 100 according to some embodiments of the present disclosure. As shown in FIG. 1, the MRI system 100 may include an MRI device 110, a network 120, one or more terminals 130, a processing device 140, and a storage device 150. In some embodiments, the MRI device 110, the processing device 140, the storage device 150, and/or the terminal(s) 130 may be connected to and/or communicate with each other via a wireless connection (e.g., the network 120), a wired connection, or a combination thereof. The connection between the components in the MRI system 100 may be variable.

The MRI device 110 may be configured to generate or provide image data (e.g., MRI data) by scanning a target subject or at least a portion of the target subject. For example, the MRI device 110 may collect the MRI data (e.g., MR signals) by applying an MRI pulse sequence on the target subject. In some embodiments, the MRI device 110 may include a single modality MRI device or a multi-modality MRI device. Exemplary multi-modality MRI devices may include a computed tomography-magnetic resonance imaging (CT-MRI) device, a positron emission tomography-magnetic resonance imaging (PET-MRI) scanner, or the like, or any combination thereof. It should be noted that the MRI device described below is merely provided for illustration purposes, and not intended to limit the scope of the present disclosure.

In some embodiments, the MRI device 110 may include, for example, a magnetic body, a gradient coil assembly, an RF coil assembly, etc. The magnetic body may generate a first magnetic field (also referred to as a main magnetic field) for polarizing the target subject to be scanned. The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the target subject. The RF coil assembly may include a plurality of RF coils. The RF coils may include one or more RF transmit coils and/or one or more RF receiver coils. The RF transmit coil(s) may transmit RF pulses to the target subject. Under the coordinated action of the main magnetic field, the gradient magnetic field, and the RF pulses, one or more MR signals relating to the target subject may be excited by the MRI pulse sequence. The RF receiver coils may acquire MR signals from the target subject according to the MRI pulse sequence.

The target subject may include patients or other experimental subjects (e.g., experimental mice or other animals). In some embodiments, the target subject may be a patient or a specific portion, organ, and/or tissue of the patient. For example, the target subject may include the head, the neck, the thorax, the heart, the stomach, a blood vessel, soft tissue, a tumor, nodules, or the like, or any combination thereof. In some embodiments, the target subject may be non-biological. For example, the target subject may include a phantom, a man-made object, etc. The terms "object" and "subject" are used interchangeably in the present disclosure.

The network 120 may include any suitable network that can facilitate the exchange of information and/or data for the MRI system 100. In some embodiments, one or more components (e.g., the MRI device 110, the terminal(s) 130, the processing device 140, the storage device 150, etc.) of the MRI system 100 may communicate information and/or data with one or more other components of the MRI system 100 via the network 120. In some embodiments, the network 120 may include one or more network access points.

The terminal(s) 130 may include a mobile device 130-1, a tablet computer 130-2, a laptop computer 130-3, or the like, or any combination thereof. In some embodiments, the mobile device 130-1 may include a smart home device, a wearable device, a mobile device, a virtual reality device, an augmented reality device, or the like, or any combination thereof. In some embodiments, the terminal(s) 130 may be part of the processing device 140.

The processing device 140 may process data and/or information obtained from one or more components (the MRI device 110, the terminal(s) 130, and/or the storage device 150) of the MRI system 100. For example, the processing device 140 may obtain the MRI data of the target subject. As another example, the processing device 140 may reconstruct an MR image of the target subject based on the MRI data. In some embodiments, the processing device 140 may be a single server or a server group. The server group may be centralized or distributed. In some embodiments, the processing device 140 may be local or remote. In some embodiments, the processing device 140 may be implemented on a cloud platform. Exemplary cloud platforms may include a private cloud, a public cloud, a hybrid cloud, a community cloud, a distributed cloud, an inter-cloud, a multi-cloud, or the like, or any combination thereof.

In some embodiments, the processing device 140 may be implemented by a computing device. For example, the computing device may include a processor, a storage, an input/output (I/O), and a communication port. In some embodiments, the processing device 140, or a portion of the processing device 140 may be implemented by a portion of the terminal 130.

The storage device 150 may store data/information (e.g., the MRI pulse sequence, the MRI data, the MR image, etc.) obtained from the MRI device 110, the terminal(s) 130, and/or any other component of the MRI system 100. In some embodiments, the storage device 150 may include a mass storage, a removable storage, a volatile read-and-write memory, a read-only memory (ROM), or the like, or any combination thereof. In some embodiments, the storage device 150 may store one or more programs and/or instructions to perform exemplary methods described in the present disclosure.

In some embodiments, the MRI system 100 may include one or more additional components and/or one or more components of the MRI system 100 described above may be omitted. Additionally or alternatively, two or more components of the MRI system 100 may be integrated into a single component. A component of the MRI system 100 may be implemented on two or more sub-components.

Figure 2:
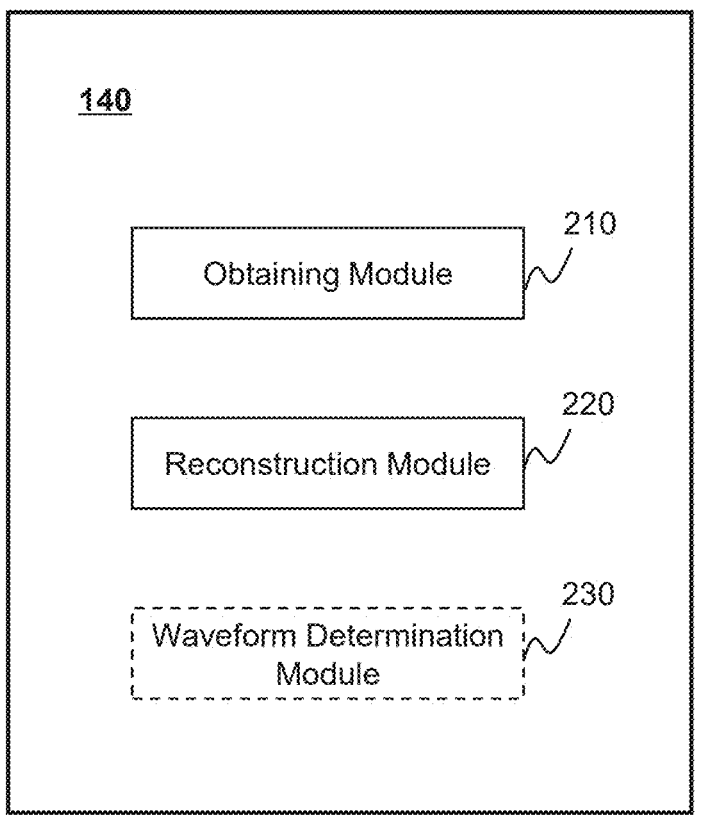
FIG. 2 is a block diagram illustrating an exemplary processing device according to some embodiments of the present disclosure.

FIG. 2 is a block diagram illustrating an exemplary processing device 140 according to some embodiments of the present disclosure. In some embodiments, the processing device 140 may be in communication with a computer-readable storage medium (e.g., the storage device 150 illustrated in FIG. 1) and execute instructions stored in the computer-readable storage medium. The processing device 140 may include an obtaining module 210 and a reconstruction module 220.

The obtaining module 210 may be configured to obtain MRI data of a target subject. The MRI data may be collected by applying an MRI pulse sequence on the target subject. The MRI pulse sequence may include a monomial RF pulse for exciting first substance in the target subject and suppressing second substance in the target subject. More descriptions regarding the obtaining the MRI data may be found elsewhere in the present disclosure. See, e.g., operation 302 and relevant descriptions thereof.

The reconstruction module 220 may be configured to reconstruct an MR image of the target subject based on the MRI data. More descriptions regarding the reconstruction of the MR image may be found elsewhere in the present disclosure. See, e.g., operation 304 and relevant descriptions thereof.

In some embodiments, the processing device 140 may further include a waveform determination module 230. The waveform determination module 230 may be configured to determine a waveform of the monomial RF pulse. For example, the waveform determination module 230 may generate a trapezoidal waveform, generate a preliminary waveform by performing exponential transformation on each point in the trapezoidal waveform, and determine the waveform of the monomial RF pulse by filtering the preliminary waveform. More descriptions regarding the reconstruction of the MR image may be found elsewhere in the present disclosure. See, e.g., FIG. 5 and relevant descriptions thereof.

In some embodiments, the processing device 140 may include one or more other modules, one or more modules mentioned above can be omitted. For example, the processing device 140 may include a storage module to store data generated by the modules in the processing device 140. In some embodiments, any two of the modules may be combined as a single module, and any one of the modules may be divided into two or more units.

Figure 3:
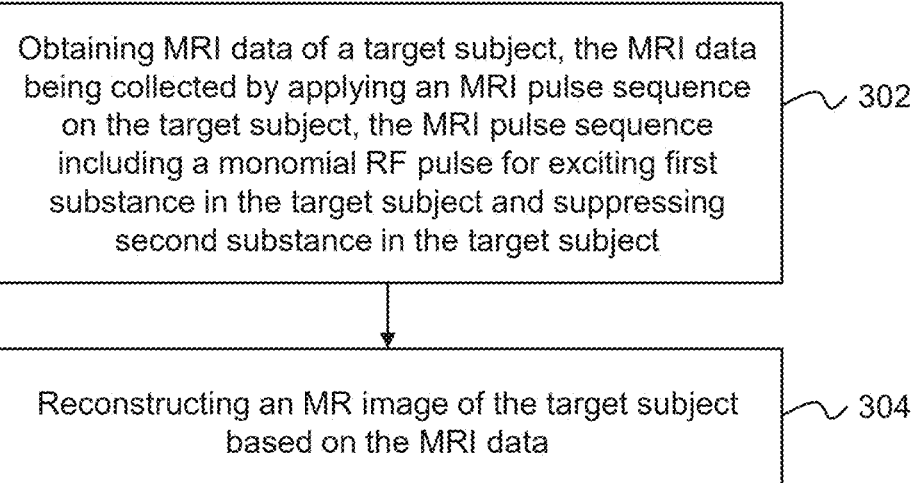
FIG. 3 is a flowchart illustrating an exemplary process for reconstructing an MRI image according to some embodiments of the present disclosure.

FIG. 3 is a flowchart illustrating an exemplary process for reconstructing an MR image according to some embodiments of the present disclosure. Process 300 may be implemented in the MRI system 100 illustrated in FIG. 1. For example, the process 300 may be stored in the storage device 150 in the form of instructions (e.g., an application), and invoked and/or executed by the processing device 140.

In 302, the processing device 140 (e.g., the obtaining module 210) may obtain MRI data of a target subject.

The MRI data may be collected by applying an MRI pulse sequence on the target subject. The MR pulse sequence may be used to scan the target subject and/or generate the MRI data. For example, an MRI device (e.g., the MRI device 110) may be directed to apply the MRI pulse sequence on the target subject, and collect the MRI data (e.g., MR signals).

In some embodiments, the MRI pulse sequence may be defined by imaging parameters and arrangements associated with the image parameters in a time sequence. For example, the MRI pulse sequence may include or be associated with one or more parameters relating to RF pulse(s), such as a bandwidth (or frequency range), an amplitude (or intensity), an application time, a duration, etc. As another example, the MRI pulse sequence may include or be associated with one or more parameters relating to a gradient field, such as an application direction, a field intensity, an application time, a duration, etc. As still another example, the MRI pulse sequence may be defined by one or more parameters relating to time, such as a repetition time (TR), an acquisition time (TA), an echo time (TE), an inversion time (TI), etc.

In some embodiments, the MRI pulse sequence may include a monomial RF pulse for exciting first substance in the target subject and suppressing second substance in the target subject. The first substance refers to a target substance that needs to be excited by the monomial RF pulse, and the second substance refers to another substance that needs to be suppressed. In some embodiments, a chemical shift of the first substance may be different from that of the second substance. For example, the first substance and the second substance may be two different substances among the water, the fat, and the silica gel. For instance, assuming a resonance frequency of the water is the same as a center frequency of the MRI device 110 (i.e., a chemical shift of the water is equal to 0 parts per million (ppm)) when an RF field intensity of the MRI device 110 is 3 Tesla (T), a chemical shift of the fat with respect to the water may be −3.5 ppm, and a chemical shift of the silica gel with respect to the water may be −4.7 ppm.

In some embodiments, the monomial RF pulse may be a monomial radio frequency (RF) pulse with off-resonant spin tipping effects (referred to as an MOST RF pulse herein). Since a center frequency of the monomial RF pulse is different from a center frequency of a substance (e.g., the water), the monomial RF pulse may be an off-resonant RF pulse. Correspondingly, signal(s) of the substance excited by the monomial RF pulse may not be as efficient as when the substance is excited by an on-resonant pulse. The off-resonant spin tipping effect refers to an effect that can tip the signal(s) of the substance toward the x-y plane which is perpendicular to the Z direction.

In some embodiments, the phase of the monomial RF pulse may be a constant value during application. That is, the phase of the monomial RF pulse remains unchanged when the monomial RF pulse is applied to the target subject. For example, the phase of the monomial RF pulse may be an arbitrary value within a range from −180 degrees to 180 degrees. It should be noted that the constant value corresponds to a single MRI pulse sequence. For example, a monomial RF pulse in a first MRI pulse sequence may correspond to a first phase, a monomial RF pulse in a second MRI pulse sequence may correspond to a second phase, and the first phase may be different from the second phase. In some embodiments, the phase of the monomial RF pulse in the MRI pulse sequence may be determined based on a system default setting, or set manually by a user (e.g., a doctor, a technician, etc.).

By fixing the phase of the monomial RF pulse as the constant value, excitation effect corresponding to the monomial RF pulse can be constant, which can reduce the complexity of the application of the monomial RF pulse, thereby improving the efficiency and accuracy of the acquisition of the MRI data.

In some embodiments, the processing device 140 may determine a waveform of the monomial RF pulse. For example, the processing device 140 may generate a trapezoidal waveform, generate a preliminary waveform by performing exponential transformation on each point in the trapezoidal waveform, and determine the waveform of the monomial RF pulse by filtering the preliminary waveform. More descriptions regarding the determination of the waveform of the monomial RF pulse may be found in elsewhere in the present disclosure (e.g., FIGS. 5 and 6, and the descriptions thereof).

In some embodiments, the processing device 140 may determine a center frequency of the monomial RF pulse. For example, the processing device 140 may determine a duration of the monomial RF pulse and an RF field intensity of the monomial RF pulse; determine, based on the duration and the RF field intensity, an estimated first frequency response profile of the first substance with respect to the monomial RF pulse and an estimated second frequency response profile of the second substance with respect to the monomial RF pulse; and determine the center frequency of the monomial RF pulse based on the estimated first frequency response profile and the estimated second frequency response profile. More descriptions regarding the determination of the center frequency of the monomial RF pulse may be found in elsewhere in the present disclosure (e.g., FIGS. 7-11, and the descriptions thereof).

By determining the phase, the waveform, and the center frequency of the monomial RF pulse, the processing device 140 may determine the monomial RF pulse. In some embodiments, the processing device 140 may determine parameters of the monomial RF pulse based on information of the target subject.

In some embodiments, the processing device 140 may determine the MRI pulse sequence based on the monomial RF pulse and a scanning protocol. The scanning protocol may include the imaging parameters (e.g., the one or more parameters relating to the gradient field, the time, etc.). In some embodiments, the scanning protocol may be obtained from the storage device 150 or an external data source. In some embodiments, the scanning protocol may be provided by the user or generated automatically, for example, according to a default setting of the MR scanner, a machine learning model.

In some embodiments, the first substance has a first frequency response profile with respect to the monomial RF pulse, and the second substance has a second frequency response profile with respect to the monomial RF pulse.

A frequency response profile may reflect a response condition (e.g., an excited state or a suppressed state) of a substance in the target subject with respect to the monomial RF pulse under different frequencies. For example, the frequency response profile may be represented by a curve or a function indicating the signal intensity (which represents the response condition) of the substance excited by the monomial RF pulse under different frequencies. In some embodiments, the frequency response profile may be used to determine one or more passbands and one or more stopbands of the substance. A passband of the substance refers to a frequency range in which the substance is excited, and a stopband of the substance refers to a frequency range in which the substance is suppressed. For example, the passband of the substance may be a frequency range in which a signal intensity of the substance is excited to be larger than or equal to a first percentage of a maximum signal intensity of the substance. The first percentage may be, for example, 90%, 92%, 95%, 98%, etc. In some embodiments, the first percentage is 95%. The stopband of the substance may be a frequency range in which a signal intensity of the substance is suppressed to be less than or equal to a second percentage of the maximum signal intensity of the substance. The second percentage may be, for example, 10%, 8%, 5%, 2%, 1%, etc. In some embodiments, the second percentage is 5%. Taking the water as an example, the passband of the water is a frequency range in which a signal intensity of the water is excited to be larger than or equal to 95% of a maximum signal intensity of the water, and the stopband of the water is a frequency range in which the signal intensity of the water is suppressed to be less than or equal to 5% of the maximum signal intensity of the water.

In some embodiments, the first frequency response profile of the first substance with respect to the monomial RF pulse may include one or more passbands in which the first substance is excited, and each of the one or more passbands may span over a locally continuous frequency range. A locally continuous frequency range may be also referred to as a closed frequency range with a limited span. The second frequency response profile of the second substance with respect to the monomial RF pulse may include one or more stopbands in which the second substance is suppressed, and at least one stopband of the one or more stopbands is a semi-infinite frequency range. At least one passband of the one or more passbands may have an overlap frequency range with the at least one stopband, and a center frequency of the monomial RF pulse may be within the overlap frequency range. In other words, the center frequency of the monomial RF pulse is within the passband(s) of the first substance and the stopband(s) of the second substance, thus, the monomial RF pulse can excite the first substance effectively while suppress the second substance effectively.

Figure 4A:
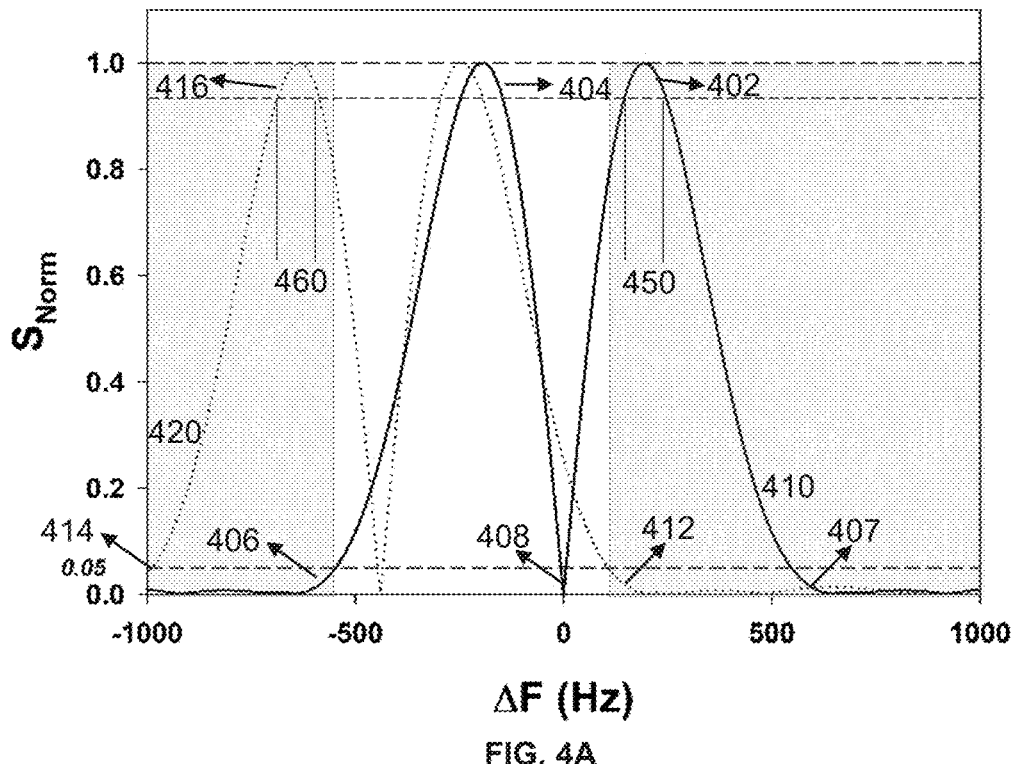
FIG. 4A is a schematic diagram illustrating exemplary frequency response profiles of first substance and second substance with respect to a monomial RF pulse according to some embodiments of the present disclosure.

Merely by way of example, referring to FIG. 4A, FIG. 4A is a schematic diagram illustrating exemplary frequency response profiles of water and fat with respect to a monomial RF pulse according to some embodiments of the present disclosure. As illustrated in FIG. 4A, an abscissa axis represents a frequency offset (ΔF) relative to a center frequency of the water, an ordinate axis represents a normalized signal intensity ($S_{Norm}$), the solid curve is the frequency response profile of water, the dotted curve is the frequency response profile of fat, wherein a unit of the abscissa axis is Hz. The normalized signal intensity of a certain substance refers to a signal intesentiy of the substance to the maximum signal intensity of the substance. If the water is first substance and the fat is second substance, a first frequency response profile 410 of the water with respect to the monomial RF pulse includes passbands 402 and 404 in which the water is excited, and each of the passbands 402 and 404 span over a locally continuous frequency range. In some embodiments, two stopbands 406 and 407 with semi-infinite frequency ranges are located at two sides of the passbands 402 and 404, and a narrow stopband 408 is located between the passbands 402 and 404. A center frequency of the narrow stopband 408 is the same as or substantially the same as an on-resonant frequency of the water (e.g., 0 Hz). The second frequency response profile 420 of the fat with respect to the monomial RF pulse includes stopbands 412 and 414 in which the fat is suppressed, and each of the stopbands 412 and 414 is a semi-infinite frequency range. The passband 402 is located within the stopband 412 and has an overlap frequency range 450 with the stopband 412, and a center frequency of the monomial RF pulse is within the overlap frequency range 450. For instance, the center frequency of the monomial RF pulse may be determined as 250 Hz, so that the water can be excited as much as possible, and the fat can be suppressed as much as possible. At this time, a signal intensity corresponding to the water is maximum, and a signal intensity corresponding to the fat is minimum.

Similarly, if the fat is the first substance and the water is the second substance, a passband 416 of the fat is within the stopband 406 of the water and has an overlap frequency range 460 with the stopband 406, and the center frequency of the monomial RF pulse is within the overlap frequency range 460. For instance, the center frequency of the monomial RF pulse may be determined as −700 Hz, so that the fat can be excited as much as possible, and the water can be suppressed as much as possible. At this time, the signal intensity corresponding to the fat is maximum, and the signal intensity corresponding to the water is minimum.

Therefore, by applying the MRI pulse sequence including the monomial RF pulse, the first substance in the target subject can be excited effectively and the second substance in the target subject can be suppressed effectively, which can reduce the interference of the second substance on the acquisition of the MRI data, thereby improving a signal to noise ratio (SNR) of the MRI data and the accuracy of the MRI data.

Figure 4B:
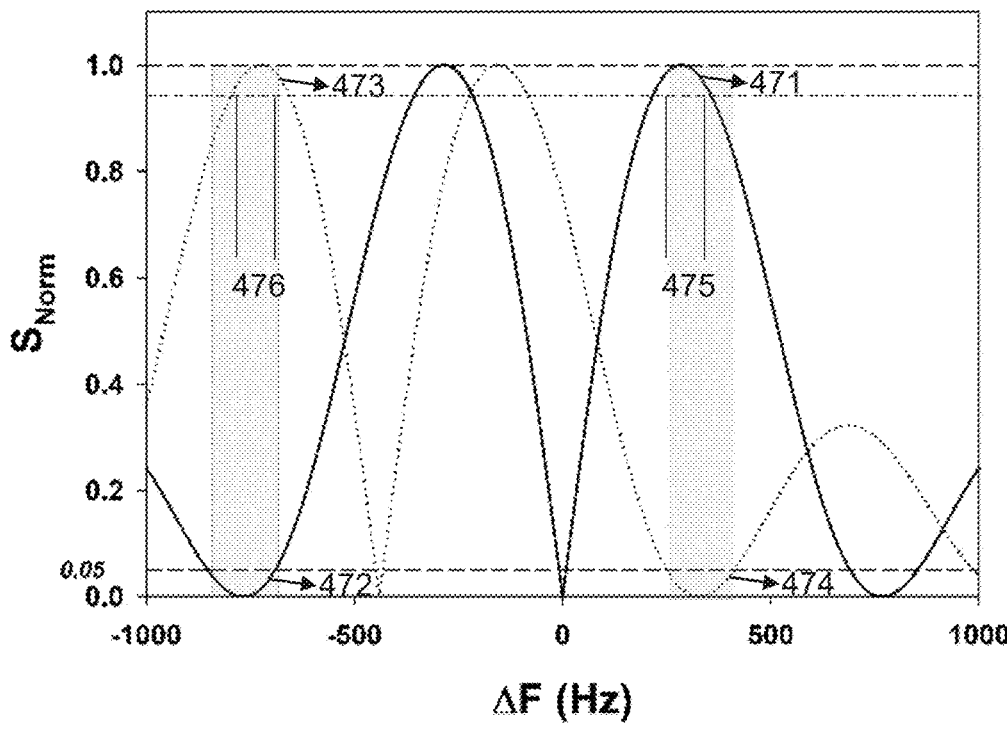
FIG. 4B is a schematic diagram illustrating exemplary frequency response profiles of first substance and second substance with respect to a binomial off-resonant rectangular (BORR) pulse according to some embodiments of the present disclosure.

Referring to FIG. 4B, FIG. 4B is a schematic diagram illustrating exemplary frequency response profiles of water and fat with respect to a BORR pulse according to some embodiments of the present disclosure. As illustrated in FIG. 4B, a portion of a passband 471 in a frequency response profile of the water has an overlap frequency range 475 with a stopband 474 in a frequency response profile of the fat. That is, the passband 471 is not located within the stopband 474. Therefore, a length of the overlap frequency range 475 is less than the passband 471. Similarly, a portion of a passband 473 in the frequency response profile of the fat has an overlap frequency range 476 with a stopband 472 in the frequency response profile of the water. That is, the passband 473 is not located within the stopband 472. Therefore, a length of the overlap frequency range 476 is less than the passband 473.

Figure 4C:
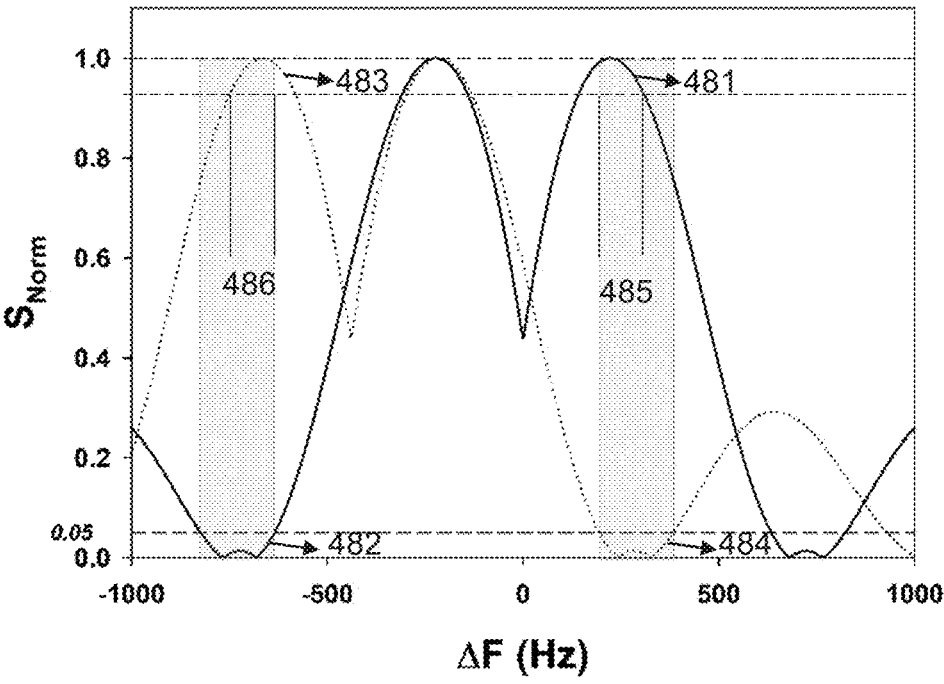
FIG. 4C is a schematic diagram illustrating exemplary frequency response profiles of first substance and second substance with respect to a lipid insensitive binomial off-resonant RF excitation (LIBRE) pulse according to some embodiments of the present disclosure.

Referring to FIG. 4C, FIG. 4C is a schematic diagram illustrating exemplary frequency response profiles of water and fat with respect to a LIBRE pulse according to some embodiments of the present disclosure. As illustrated in FIG. 4C, a portion of a passband 481 in a frequency response profile of the water has an overlap frequency range 485 with a stopband 484 in a frequency response profile of the fat. That is, the passband 481 is not located within the stopband 484. Therefore, a length of the overlap frequency range 485 is less than the passband 481. Similarly, a portion of a passband 483 in the frequency response profile of the fat has an overlap frequency range 486 with a stopband 482 in the frequency response profile of the water. That is, the passband 483 is not located within the stopband 482. Therefore, a length of the overlap frequency range 486 is less than the passband 483.

By comparing FIGS. 4A-4C, since at least one stopband of the second substance with respect to the monomial RF pulse is the semi-infinite frequency range, a passband of the first substance normally has a large overlap frequency range with the at least one stopband (e.g., the whole passband of the first substance can be within one stopband of the second substance), therefore the center frequency of the monomial RF pulse can be selected in the large overlap frequency range, which can improve a selection range of the center frequency of the monomial RF pulse, thereby improving the applicability of the monomial RF pulse.

In addition, the specially designed monomial RF pulse is especially beneficial for applications under high fields and ultra high fields, not only showing insensitivity towards $B_0$ and $B_1$ inhomogeneity that are usually prominent in high fields, but also produces relative lower specific absorption rate (SAR) of RF energy due to an off-resonant characteristic of the specially designed monomial RF pulse. For instance, since the frequency ranges of the one or more stopbands are semi-infinite (that is, the frequency ranges of the one or more stopbands are relatively broad), frequencies corresponding to the $B_0$ field can be within the one or more stopbands even though the $B_0$ field is inhomogeneous, which can suppress the second substance in the target subject effectively. That is, the specially designed monomial RF pulse is insensitivity towards $B_0$ inhomogeneity. The frequency response profiles of the substance(s) are substantially the same even though the $B_1$ field is inhomogeneous. That is, the specially designed monomial RF pulse is insensitivity towards $B_1$ inhomogeneity.

In some embodiments, the processing device 140 may obtain the MRI data from the MRI device (e.g., the MRI device 110) or a storage device (e.g., the storage device 150, a database, or an external storage) that stores the MRI data of the target subject.

In 304, the processing device 140 (e.g., the reconstruction module 220) may reconstruct an MR image of the target subject based on the MRI data.

The MR image may be used for diagnosis and/or treatment.

In some embodiments, the processing device 140 may generate the MR image of the target subject by reconstructing the MRI data using an image reconstruction algorithm. For example, the processing device 140 may obtain k-space data by filling, based on the MRI data, a k-space using a transform operation (e.g., Fourier Transform), and generate the MR image by reconstructing the k-space data using the image reconstruction algorithm. Exemplary image reconstruction algorithms may include a Fourier reconstruction algorithm, a parallel reconstruction algorithm (e.g., a sensitivity encoding algorithm, a generalized auto-calibrating partially parallel acquisition (GRAPPA) algorithm, an iterative self-consistent parallel imaging reconstruction algorithm, a simultaneous multi-slice imaging algorithm, a 3D parallel reconstruction algorithm, etc.), a compressed sensing (CS) reconstruction algorithm, a deep learning-based reconstruction algorithm, or the like, or any combination thereof.

In some embodiments, the processing device 140 may further post-process the MR image. Exemplary post-processing operations may include image deformation, image enhancement, image denoising, image smoothing, or the like, or any combination thereof.

In some embodiments, the processing device 140 may display the MR image of the target subject. For example, after the MR image is reconstructed, the processing device 140 may display the MR image through a display screen (e.g., a display screen of the terminal(s) 130), and the user may perform the diagnosis and/or treatment based on the MR image. Exemplary display screens may include a liquid crystal display screen, an electronic ink display screen, etc.

According to some embodiments of the present disclosure, the MRI data of the target subject can be collected by applying the MRI pulse sequence on the target subject. The monomial RF pulse in the MRI pulse sequence can be used to excite the first substance in the target subject and suppress the second substance in the target subject. Therefore, the interference of the second substance on the acquisition of the MRI data can be reduced, which can improve the SNR of the MRI data, thereby improving the accuracy of the MRI data and/or the MRI image.

Figure 5:
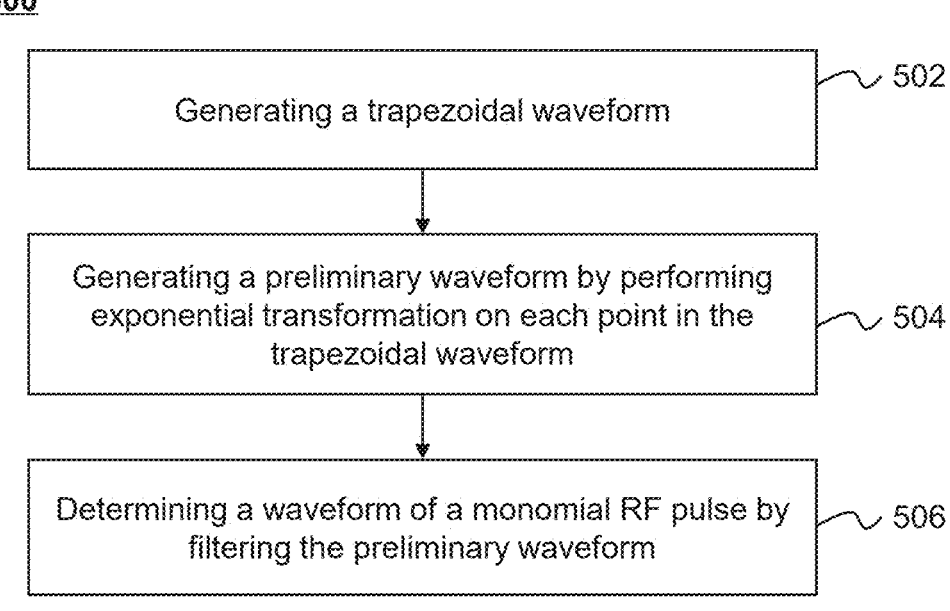
FIG. 5 is a flowchart illustrating an exemplary process for determining a waveform of a monomial RF pulse according to some embodiments of the present disclosure.

FIG. 5 is a flowchart illustrating an exemplary process 500 for determining a waveform of a monomial RF pulse according to some embodiments of the present disclosure. In some embodiments, the process 500 may be performed to achieve at least part of operation 302 as described in connection with FIG. 3.

In 502, the processing device 140 (e.g., the waveform determination module 230) may generate a trapezoidal waveform.

The trapezoidal waveform refers to a waveform that has a shape of a trapezoid. For example, the trapezoidal waveform may be formed by a plurality of points, and each point in the trapezoidal waveform may correspond to an amplitude and a phase. The trapezoidal waveform may include a top side having a first length and a bottom side having a second length. The top side is parallel to the bottom side. The second length may be equal to a duration of the monomial RF pulse. For example, the duration of the monomial RF pulse may be within a range from 1 millisecond to 3 milliseconds.

In some embodiments, the first length may be greater than zero and smaller than the second length. For example, the first length may be greater than or equal to 0.1 times the second length and smaller than the second length. As another example, the first length may be greater than or equal to 0.11 times the second length and smaller than or equal to 0.8 times the second length. As still another example, the first length may be greater than or equal to 0.12 times the second length and smaller than or equal to 0.6 times the second length. As yet another example, the first length may be greater than or equal to 0.13 times the second length and smaller than or equal to 0.4 times the second length. As yet another example, the first length may be greater than or equal to 0.14 times the second length and smaller than or equal to 0.2 times the second length. As yet another example, the first length may be equal to 0.15 times the second length.

Merely by way of example, referring to FIG. 6, an abscissa axis may represent the time, and an ordinate axis may represent an amplitude (or a signal intensity). A top side of a trapezoidal waveform 610 has a first length $\tau'$, a bottom side of the trapezoidal waveform 610 has a second length $\tau$, and the first length $\tau'$ is equal to 0.15 times the second length $\tau$.

In some embodiments, a shape of the trapezoidal waveform may be a symmetrical trapezoid. That is, a connection line between a center point of the top side and a center point of the bottom side is perpendicular to the top side (or the bottom side). Alternatively, the shape of the trapezoidal waveform may be an asymmetric trapezoid. That is, the connection line between the center point of the top side and the center point of the bottom side is not perpendicular to the top side (or the bottom side).

In some embodiments, the processing device 140 may generate a triangular waveform instead of the trapezoidal waveform. That is, the first length is equal to 0.

In 504, the processing device 140 (e.g., the waveform determination module 230) may generate a preliminary waveform by performing exponential transformation on each point in the trapezoidal waveform.

For example, the exponential transformation may be performed on each point in the trapezoidal waveform according to Equation (1):

$$I_b = I_a^q, \qquad (1)$$

where $I_a$ refers to an amplitude (or a signal intensity) of the point in the trapezoidal waveform; $I_b$ refers to an amplitude (or a signal intensity) of a corresponding point in the preliminary waveform; and q refers to an exponent of the exponential transformation. As used herein, q is an arbitrary value larger than 1, such as 1.1, 1.2, 1.4, 1.6, 1.8, 2.0, 2.5, 3.0, 5.0, etc. In some embodiments, q is equal to 2.

In 506, the processing device 140 (e.g., the waveform determination module 230) may determine a waveform of the monomial RF pulse by filtering the preliminary waveform.

In some embodiments, the processing device 140 may filter the preliminary waveform using a filtering algorithm. Exemplary filtering algorithms may include a Gaussian filtering algorithm, a median filtering algorithm, a bilateral filtering algorithm, a guided filtering algorithm, a weighted least square filtering algorithm, a non-local mean filtering algorithm, or the like, or any combination thereof. For example, the processing device 140 may filter the preliminary waveform using the Gaussian filtering algorithm.

Merely by way of example, referring to FIG. 6, FIG. 6 is a schematic diagram illustrating an exemplary process for determining a waveform of a monomial RF pulse according to some embodiments of the present disclosure. As illustrated in FIG. 6, a preliminary waveform 620 may be generated by performing exponential transformation on each point in the trapezoidal waveform 610 according to Equation (1), wherein q is equal to 2. And then, a waveform 630 of the monomial RF pulse may be determined by filtering the preliminary waveform 620.

FIG. 7 is a flowchart illustrating an exemplary process 700 for determining a center frequency of a monomial RF pulse according to some embodiments of the present disclosure. In some embodiments, the process 700 may be performed to achieve at least part of operation 302 as described in connection with FIG. 3.

In 702, the processing device 140 (e.g., the obtaining module 210) may determine a duration of a monomial RF pulse and an RF field intensity of the monomial RF pulse.

As aforementioned, the duration of the monomial RF pulse is equal to the second length of the trapezoidal waveform. The duration of the monomial RF pulse may be determined when generating the trapezoidal waveform as described in connection with operation 502. In some embodiments, the duration of the monomial RF pulse may be determined based on a system default setting, or set manually by a user. For example, the second length may be determined as an arbitrary value within a range from 1 millisecond to 3 milliseconds.

The RF field intensity of the monomial RF pulse may be less than or equal to a maximum RF field intensity of an MRI device (e.g., the MRI device 110) that applies an MRI pulse sequence including the monomial RF pulse. The maximum RF field intensity may relate to information (e.g., a power, a usage year, etc.) of the MRI device. For example, the maximum RF field intensity may be 1.5 T, 3 T, 7 T, 10 T, etc.

In some embodiments, the RF field intensity of the monomial RF pulse may be determined based on the system default setting, or set manually by the user. For example, the RF field intensity may be determined as an arbitrary value within a range from 0 to the maximum RF field intensity (e.g., 1.5 T, 3 T, 7 T, 10 T, etc.). More descriptions regarding the duration and the RF field intensity of the monomial RF pulse may be found in elsewhere in the present disclosure (e.g., FIG. 8 and the descriptions thereof).

In 704, the processing device 140 (e.g., the obtaining module 210) may determine, based on the duration and the RF field intensity, an estimated first frequency response profile of the first substance with respect to the monomial RF pulse and an estimated second frequency response profile of the second substance with respect to the monomial RF pulse.

An estimated frequency response profile refers to a frequency response profile that is estimated based on the duration and the RF field intensity.

In some embodiments, the processing device 140 may determine peak width information based on the duration, and determine peak frequency information based on the RF field intensity. Further, the processing device 140 may determine the estimated first frequency response profile and the estimated second frequency response profile based on the peak width information and the peak frequency information. More descriptions regarding the determination of the estimated first frequency response profile and the estimated second frequency response profile may be found in elsewhere in the present disclosure (e.g., FIGS. 8-11 and the descriptions thereof).

In 706, the processing device 140 (e.g., the obtaining module 210) may determine a center frequency of the monomial RF pulse based on the estimated first frequency response profile and the estimated second frequency response profile.

The center frequency of the monomial RF pulse may be represented by a frequency offset relative to a center frequency of the MRI device or an absolute center frequency of the monomial RF pulse.

In some embodiments, the processing device 140 may determine one or more estimated passbands in which the first substance is excited based on the estimated first frequency response profile and one or more estimated stopbands in which the second substance is suppressed based on the estimated second frequency response profile. The processing device 140 may determine an estimated overlap frequency range between the one or more estimated passbands and the one or more estimated stopbands, and determine the center frequency that is within the estimated overlap frequency range. More descriptions regarding the determination of the center frequency of the monomial RF pulse may be found in elsewhere in the present disclosure (e.g., FIGS. 8-11 and the descriptions thereof).

According to some embodiments of the present disclosure, the estimated first frequency response profile of the first substance with respect to the monomial RF pulse and the estimated second frequency response profile of the second substance with respect to the monomial RF pulse can be determined based on the duration and the RF field intensity, and the center frequency of the monomial RF pulse may be determined based on the estimated first frequency response profile and the estimated second frequency response profile. In this way, the accuracy of the determination of the estimated first frequency response profile and the estimated second frequency response profile can be improved, which can improve the accuracy of the determination of the center frequency of the monomial RF pulse, thereby improving the image quality of the MRI image.

Figure 8:
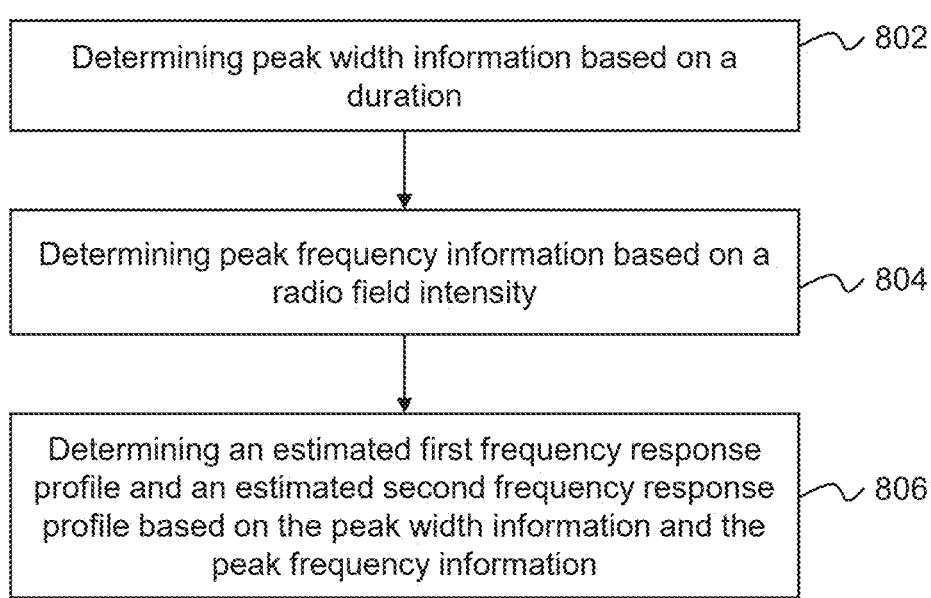
FIG. 8 is a flowchart illustrating an exemplary process for determining an estimated first frequency response profile and an estimated second frequency response profile according to some embodiments of the present disclosure.

FIG. 8 is a flowchart illustrating an exemplary process 800 for determining an estimated first frequency response profile and an estimated second frequency response profile according to some embodiments of the present disclosure. In some embodiments, the process 800 may be performed to achieve at least part of operation 704 as described in connection with FIG. 7.

In 802, the processing device 140 (e.g., the obtaining module 210) may determine peak width information based on a duration of a monomial RF pulse.

The peak width information may include a peak width of each peak in the estimated frequency response profiles (i.e., the estimated first and second frequency response profiles). A peak refers to a passband peak (i.e., the peak of a passband peak) of a frequency response profile. In some embodiments, the peak width information may be represented by a half-peak width of each peak in the estimated frequency response profiles.

In some embodiments, the duration of the monomial RF pulse may relate to the peak width information of the estimated frequency response profiles. For example, if the duration of the monomial RF pulse is relatively large, the half-peak width of each peak in the estimated frequency response profiles may be relatively small. Correspondingly, the span of the one or more passbands and one or more stopbands in the estimated frequency response profiles may be relatively small. It should be noted that the duration of the monomial RF pulse relates to the peak width information, but the center frequency of each peak in the estimated frequency response profiles is not affected by the duration of the monomial RF pulse. For example, when the duration of the monomial RF pulse changes, a distance between a center frequency of each of the one or more peaks corresponding to the first substance and a center frequency of each of the one or more peaks corresponding to the second substance remains unchanged.

In some embodiments, the duration may be inversely proportional to the peak width information (e.g., the half-peak width) of each of the one or more peaks, wherein the inverse proportion coefficient may be a fixed value for the monomial RF pulse. Therefore, the processing device 140 may determine the peak width information based on the duration of the monomial RF pulse and the inverse proportion coefficient.

In 804, the processing device 140 (e.g., the obtaining module 210) may determine peak frequency information based on an RF field intensity.

The peak frequency information refers to information relating to a center frequency of each peak in the estimated frequency response profiles. In some embodiments, the peak frequency information may include a count of center frequencies (or passband peaks), the value of the center frequency of each peak, an amplitude (or a signal intensity) of each peak, or the like, or any combination thereof.

The RF field refers to an electro-magnetic field generated by applying the monomial RF pulse. Since an amplitude (or a signal intensity) of the monomial RF pulse changes during its application as shown in FIG. 6, an intensity of the RF field may be changed. Therefore, the RF field intensity refers to a maximum intensity of the RF field. In some embodiments, the RF field intensity may relate to a voltage of an RF amplifier (used to apply the RF pulses) of an MRI device (e.g., the MRI device 110). The higher the voltage is, the larger the RF field intensity may be.

In some embodiments, the RF field intensity of the monomial RF pulse may relate to the shape of the estimated frequency response profiles. For example, the RF field intensity of the monomial RF pulse may affect the center frequency and the amplitude (or the signal intensity) of each peak in the estimated frequency response profile.

In some embodiments, the processing device 140 may determine a threshold intensity relating to the RF field intensity, and determine the peak frequency information based on the RF field intensity and the threshold intensity. The threshold intensity may correspond to a preset equivalent flip angle.

A flip angle (or an excitation angle) refers to a deviation angle that a macroscopic magnetization vector of the substance (e.g., the first substance, the second substance) deviates from an equilibrium state (i.e., a $B_0$ direction of the MRI device). The preset equivalent flip angle refers to an excitation effect that causes the macroscopic magnetization vector of the substance to deviate a preset flip angle from the equilibrium state. For example, if the preset equivalent flip angle is 90 degrees, the excitation effect may be that the macroscopic magnetization vector of the substance deviates 90 degrees from the equilibrium state. Since the excitation effect is a cumulative effect that the substance is under a certain RF field intensity for a certain duration, when the duration and the preset equivalent flip angle is determined, the threshold intensity relating to the RF field intensity may be determined.

In some embodiments, an RF pulse with the threshold intensity corresponding to the preset equivalent flip angle may be used to achieve an excitation effect corresponding to the equivalent flip angle. For example, when the preset equivalent flip angle is 90 degrees, an RF pulse with the threshold intensity corresponding to 90 degrees can achieve an excitation effect of 90 degrees.

In some embodiments, the processing device 140 may determine the peak frequency information by comparing the RF field intensity and the threshold intensity. For example, if the RF field intensity is less than the threshold intensity, the peak frequency information of the substance may include that an estimated frequency response profile of a substance includes one passband and one passband peak, two stopbands are located at two side of the passband, a center frequency of the passband peak is the same as or substantially the same as an on-resonant frequency of the substance, the excitation degree of the substance by the monomial RF pulse is positively correlated with the RF field intensity when the RF field intensity is less than the threshold intensity, an equivalent flip angle by the monomial RF pulse is positively correlated with the RF field intensity when the RF field intensity is less than the threshold intensity, or the like, or any combination thereof.

As another example, if the RF field intensity is much larger than the threshold intensity (e.g., larger than or equal to twice the threshold intensity), the peak frequency information of the substance may include that an estimated frequency response profile of a substance includes two passbands and two passband peaks, two stopbands having the semi-infinite frequency range are located at two side of the two passbands, a center frequency of each passband peak is different from the on-resonant frequency of the substance, a third stopband (e.g., a narrow stopband) is located between the two passbands and a center frequency of the third stopband is the same as or substantially the same as an on-resonant frequency of the substance, an equivalent flip angle by the monomial RF pulse remains 90 degrees when the RF field intensity is equal to the maximum signal intensity, or the like, or any combination thereof.

As still another example, if the RF field intensity is larger than the threshold intensity and less than twice the threshold intensity, the peak frequency information of the substance may include that an estimated frequency response profile of a substance includes two passbands and two passband peaks, two stopbands are located at two side of the two passbands, a center frequency of each passband peak is different from the on-resonant frequency of the substance, a semi-stopband is located between the two passbands and a center frequency of the semi-stopband is the same as or substantially the same as an on-resonant frequency of the substance, an equivalent flip angle by the monomial RF pulse remains 90 degrees when the RF field intensity is equal to the maximum signal intensity, or the like, or any combination thereof.

In 806, the processing device 140 (e.g., the obtaining module 210) may determine an estimated first frequency response profile and an estimated second frequency response profile based on the peak width information and the peak frequency information.

For example, the estimated first frequency response profile and the estimated second frequency response profile may be determined by combining the peak width information, the peak frequency information, and on-resonant frequencies of the first substance and the second substance. Taking the water as an example, the count of center frequencies (or passband peaks) and the value of the center frequency of each peak may be determined based on the peak frequency information, and the half-peak width of each peak may be determined based on the peak width information, thereby determining an estimated frequency response profile of the water.

In some embodiments, after the estimated first frequency response profile and the estimated second frequency response profile are determined, the processing device 140 may determine a center frequency of the monomial RF pulse based on the estimated first frequency response profile and the estimated second frequency response profile.

For illustration purposes, three examples of determining the estimated first frequency response profile, the estimated second frequency response profile, and the center frequency of the monomial RF pulse are provided below.

Example 1

Figure 9:
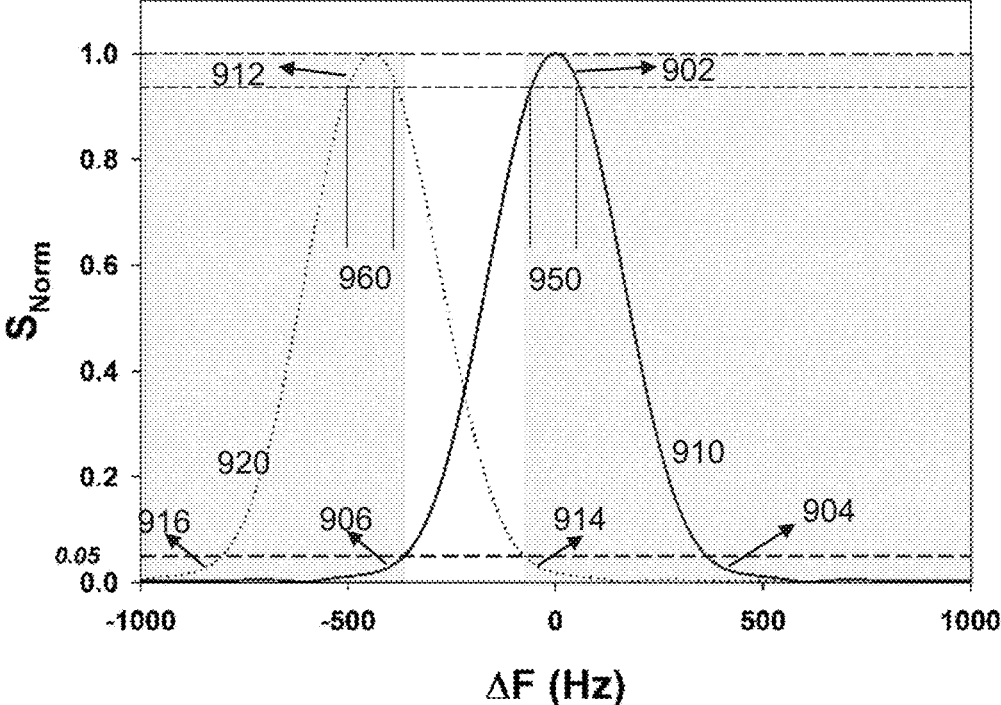
FIG. 9 is a schematic diagram illustrating an exemplary estimated first frequency response profile and an exemplary estimated second frequency response profile according to some embodiments of the present disclosure.

Referring to FIG. 9, when the RF field intensity is less than the threshold intensity, an estimated first frequency response profile 910 of the water (an exemplary first substance) and an estimated second frequency response profile 920 of the fat (an exemplary second substance) may be determined based on the peak width information and the peak frequency information.

As illustrated in FIG. 9, the estimated first frequency response profile 910 of the water includes an estimated passband 902, and two estimated stopbands 904 and 906 are located at two sides of the estimated passband 902. The estimated second frequency response profile 920 of the fat includes an estimated passband 912, and two estimated stopbands 914 and 916 are located at two sides of the estimated passband 912. An estimated overlap frequency range 950 between the estimated passband 902 and the estimated stopband 914 is determined, and a center frequency of a monomial RF pulse with respect to the water can be within the estimated overlap frequency range 950. For example, the center frequency of the monomial RF pulse with respect to the water may be located at a center frequency of the estimated overlap frequency range 950 (or the estimated passband 902 of the water).

Similarly, if the first substance to be excited is the fat and the second substance to be suppressed is the water, a center frequency of a monomial RF pulse with respect to the fat can be within an estimated overlap frequency range 960. For example, the center frequency of the monomial RF pulse with respect to the fat may be located at a center frequency of the estimated overlap frequency range 960 (or the estimated passband 912 of the fat).

Example 2

Figure 10:
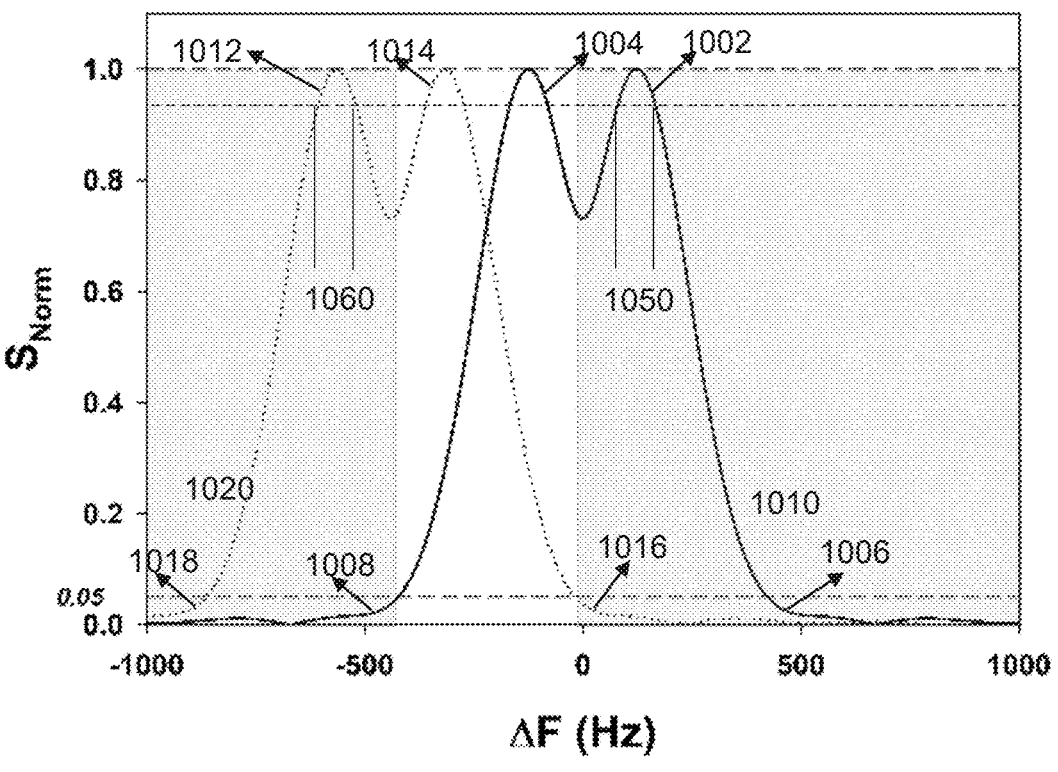
FIG. 10 is a schematic diagram illustrating an exemplary estimated first frequency response profile and an exemplary estimated second frequency response profile according to some embodiments of the present disclosure.

Referring to FIG. 10, when the RF field intensity is larger than the threshold intensity and less than twice the threshold intensity, an estimated first frequency response profile 1010 of the water (an exemplary first substance) and an estimated second frequency response profile 1020 of the fat (an exemplary second substance) may be determined based on the peak width information and the peak frequency information.

As illustrated in FIG. 10, the estimated first frequency response profile 1010 of the water includes two estimated passband 1002 and 1004, and two estimated stopbands 1006 and 1008 are located at two sides of the estimated passbands 1002 and 1004. The estimated second frequency response profile 1020 of the fat includes two estimated passband 1012 and 1014, and two estimated stopbands 1016 and 1018 are located at two sides of the estimated passbands 1012 and 1014. An estimated overlap frequency range 1050 between the estimated passband 1002 and the estimated stopband 1016 is determined, and a center frequency of a monomial RF pulse with respect to the water can be within the estimated overlap frequency range 1050. For example, the center frequency of the monomial RF pulse with respect to the water may be located at a center frequency of the estimated overlap frequency range 1050 (or the estimated passband 1002 of the water).

Similarly, if the first substance to be excited is the fat and the second substance to be suppressed is the water, a center frequency of a monomial RF pulse with respect to the fat can be within an estimated overlap frequency range 1060. For example, the center frequency of the monomial RF pulse with respect to the fat may be located at a center frequency of the estimated overlap frequency range 1060 (or the estimated passband 1012 of the fat).

Example 3

Figure 11:
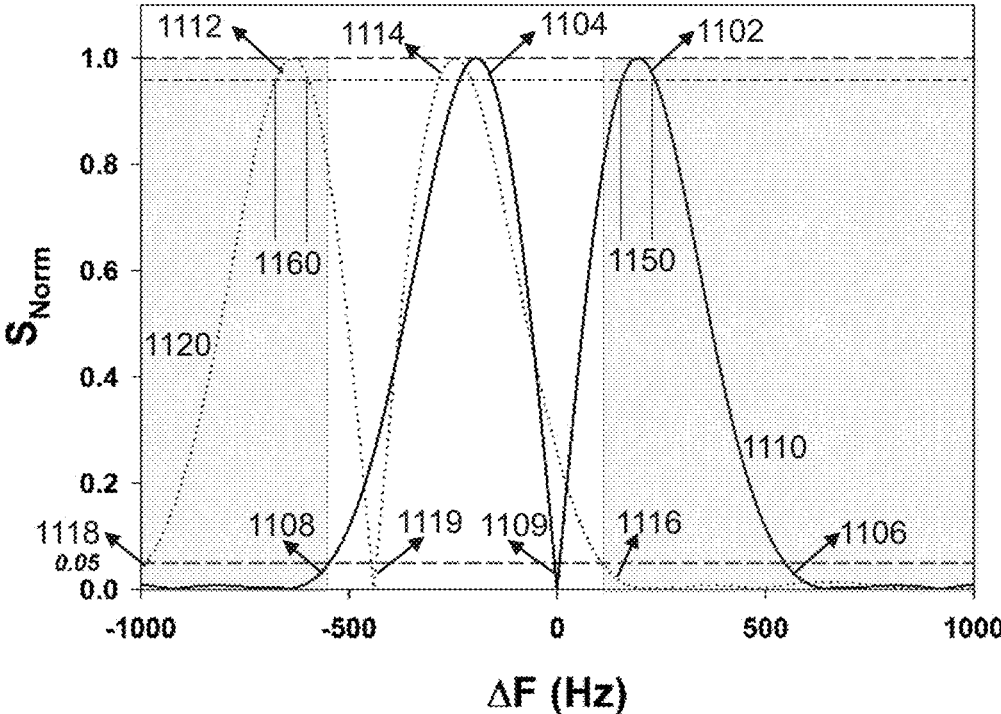
FIG. 11 is a schematic diagram illustrating an exemplary estimated first frequency response profile and an exemplary estimated second frequency response profile according to some embodiments of the present disclosure.

Referring to FIG. 11, when the RF field intensity is larger than or equal to twice the threshold intensity, an estimated first frequency response profile 1110 of the water (an exemplary first substance) and an estimated second frequency response profile 1120 of the fat (an exemplary second substance) may be determined based on the peak width information and the peak frequency information.

As illustrated in FIG. 11, the estimated first frequency response profile 1110 of the water includes two estimated passband 1102 and 1104, and two estimated stopbands 1106 and 1108 are located at two sides of the estimated passbands 1102 and 1104. A narrow estimated stopband 1109 is located between the estimated passbands 1102 and 1104, and a center frequency of the narrow estimated stopband 1109 is an on-resonant frequency of the water (e.g., 0 Hz). The estimated second frequency response profile 1120 of the fat includes two estimated passband 1112 and 1114, and two estimated stopbands 1116 and 1118 are located at two sides of the estimated passbands 1112 and 1114. A narrow estimated stopband 1119 is located between the estimated passbands 1112 and 1114, and a center frequency of the narrow estimated stopband 1119 is an on-resonant frequency of the fat (e.g., −440 Hz). An estimated overlap frequency range 1150 between the estimated passband 1102 and the estimated stopband 1116 is determined, and a center frequency of a monomial RF pulse with respect to the water can be within the estimated overlap frequency range 1150. For example, the center frequency of the monomial RF pulse with respect to the water may be located at a center frequency of the estimated overlap frequency range 1150 (or the estimated passband 1102 of the water).

Similarly, if the first substance to be excited is the fat and the second substance to be suppressed is the water, a center frequency of a monomial RF pulse with respect to the fat can be within an estimated overlap frequency range 1160. For example, the center frequency of the monomial RF pulse with respect to the fat may be located at a center frequency of the estimated overlap frequency range 1160 (or the estimated passband 1112 of fat).

It should be noted that the descriptions of the processes 300, 500, 700, and 800 are provided for the purposes of illustration, and are not intended to limit the scope of the present disclosure. For persons having ordinary skills in the art, various variations and modifications may be conducted under the teaching of the present disclosure. For example, the processes 300, 500, 700, and 800 may be accomplished with one or more additional operations not described, and/or without one or more of the operations discussed. Additionally, the order in which the operations of the processes 300, 500, 700, and 800 are not intended to be limiting. However, those variations and modifications may not depart from the protection of the present disclosure.

Figure 12:
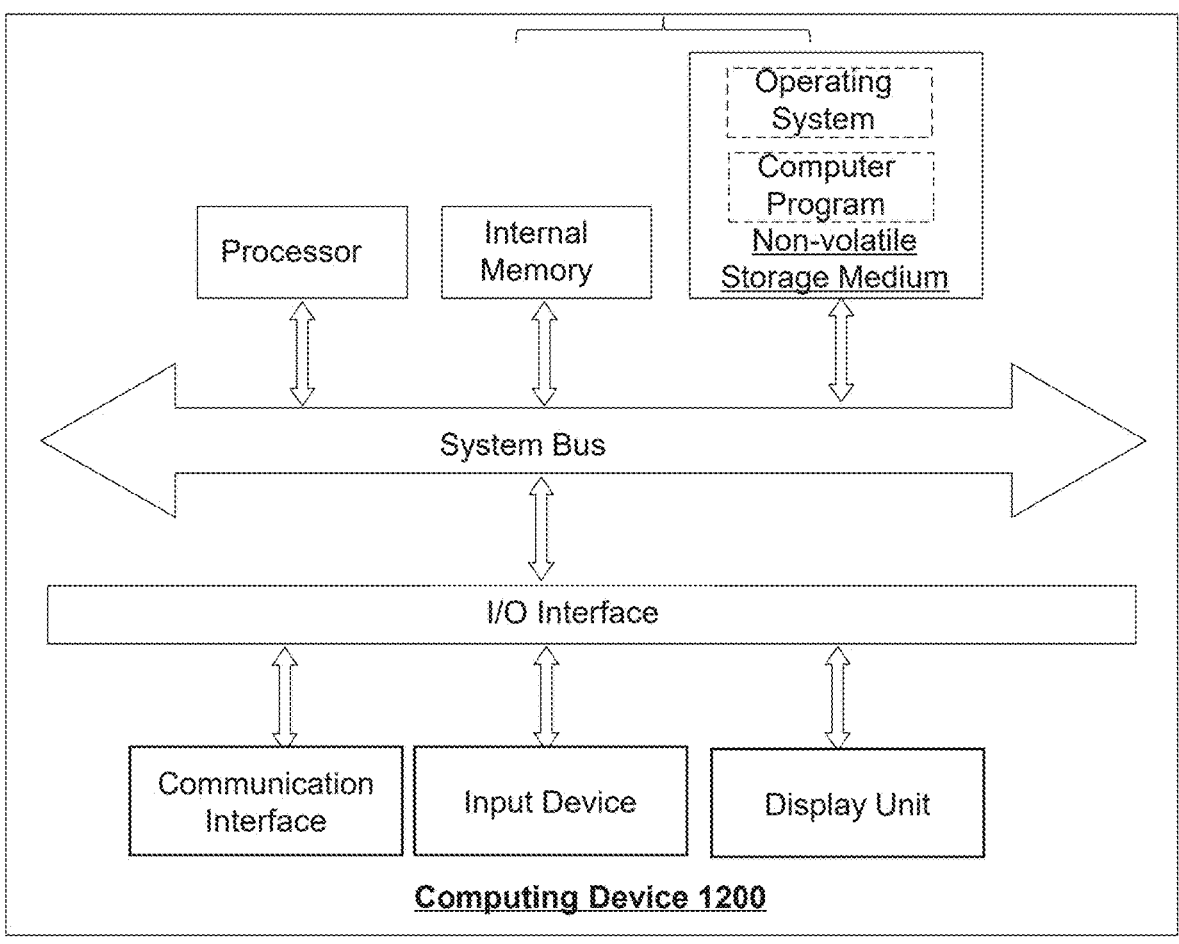
FIG. 12 is a schematic diagram illustrating an exemplary computing device according to some embodiments of the present disclosure.

FIG. 12 is a schematic diagram illustrating an exemplary computing device 1200 according to some embodiments of the present disclosure.

In some embodiments, one or more components of the MRI system 100 may be implemented on the computing device 1200. For example, a processing engine may be implemented on the computing device 1200 and configured to implement the functions and/or methods disclosed in the present disclosure.

The computing device 1200 may include any components used to implement the MRI system 100 described in the present disclosure. For example, the processing device 140 may be implemented through hardware, software program, firmware, or any combination thereof, on the computing device 1200. For illustration purposes, only one computer is described in FIG. 12, but computing functions related to the MRI system 100 described in the present disclosure may be implemented in a distributed fashion by a group of similar platforms to spread the processing load of the MRI system 100.

The computing device 1200 may include a communication port connected to a network to achieve data communication. The computing device 1200 may include a processor (e.g., a central processing unit (CPU)), a memory, a communication interface, a display unit, and an input device connected by a system bus. The processor of the computing device 1200 may be used to provide computing and control capabilities. The memory of the computing device 1200 may include a non-volatile storage medium, an internal memory. The non-volatile storage medium may store an operating system and a computer program. The internal memory may provide an environment for the execution of the operating system and the computer program in the non-volatile storage medium. The communication interface of the computing device 1200 may be used for wired or wireless communication with an external terminal. The wireless communication may be realized through Wi-Fi, a mobile cellular network, a near field communication (NFC), etc. When the computer program is executed by the processor, a method for determining feature points may be implemented. The display unit of the computing device 1200 may include a liquid crystal display screen or an electronic ink display screen. The input device of the computing device 1200 may include a touch layer covered on the display unit, a device (e.g., a button, a trackball, a touchpad, etc.) set on the housing of the computing device 1200, an external keyboard, an external trackpad, an external mouse, etc.

Merely for illustration, only one processor is described in FIG. 12. However, it should be noted that the computing device 1200 in the present disclosure may also include multiple processors. Thus operations and/or method steps that are performed by one processor as described in the present disclosure may also be jointly or separately performed by the multiple processors. For example, if the processor of the computing device 1200 in the present disclosure executes both operation A and operation B, it should be understood that operation A and operation B may also be performed by two or more different processors jointly or separately (e.g., a first processor executes operation A and a second processor executes operation B, or the first and second processors jointly execute operations A and B).

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended for those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this disclosure are not necessarily all referring to the same embodiment. Furthermore, the particular features, structures, or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method for magnetic resonance imaging (MRI), implemented on a computing device having at least one processor and at least one storage device, the method comprising:

obtaining MRI data of a target subject, the MRI data being collected by applying an MRI pulse sequence on the target subject, the MRI pulse sequence including a monomial radio frequency (RF) pulse for exciting first substance in the target subject and suppressing second substance in the target subject; and reconstructing a magnetic resonance (MR) image of the target subject based on the MRI data, wherein a waveform of the monomial RF pulse is determined by:

generating a trapezoidal waveform;

generating a preliminary waveform by performing exponential transformation on each point in the trapezoidal waveform; and determining the waveform of the monomial RF pulse by filtering the preliminary waveform.

2. The method of claim 1, wherein the phase of the monomial RF pulse is a constant value during application.

3. The method of claim 1, wherein the trapezoidal waveform includes a top side having a first length and a bottom side having a second length, the first length is greater than zero and smaller than the second length.

4. The method of claim 1, wherein a center frequency of the monomial RF pulse is determined by:

determining a duration of the monomial RF pulse and an RF field intensity of the monomial RF pulse;

determining, based on the duration and the RF field intensity, an estimated first frequency response profile of the first substance with respect to the monomial RF pulse and an estimated second frequency response profile of the second substance with respect to the monomial RF pulse; and determining the center frequency of the monomial RF pulse based on the estimated first frequency response profile and the estimated second frequency response profile.

5. The method of claim 4, wherein the estimated first frequency response profile and the estimated second frequency response profile are determined by:

determining peak width information based on the duration;

determining peak frequency information based on the RF field intensity; and determining the estimated first frequency response profile and the estimated second frequency response profile based on the peak width information and the peak frequency information.

6. The method of claim 5, wherein the determining peak frequency information based on the RF field intensity comprises:

determining a threshold intensity relating to the RF field intensity, the threshold intensity corresponding to a preset equivalent flip angle; and determining the peak frequency information based on the RF field intensity and the threshold intensity.

7. The method of claim 4, wherein the determining the center frequency of the monomial RF pulse based on the estimated first frequency response profile and the estimated second frequency response profile comprises:

determining one or more estimated passbands in which the first substance is excited based on the estimated first frequency response profile;

determining one or more estimated stopbands in which the second substance is suppressed based on the estimated second frequency response profile;

determining an estimated overlap frequency range between the one or more estimated passbands and the one or more estimated stopbands; and determining the center frequency that is within the estimated overlap frequency range.

8. The method of claim 1, wherein a first frequency response profile of the first substance with respect to the monomial RF pulse includes one or more passbands in which the first substance is excited, each of the one or more passbands spanning over a locally continuous frequency range, a second frequency response profile of the second substance with respect to the monomial RF pulse includes one or more stopbands in which the second substance is suppressed, at least one stopband of the one or more stopbands being a semi-infinite frequency range, at least one passband of the one or more passbands has an overlap frequency range with the at least one stopband, and a center frequency of the monomial RF pulse is within the overlap frequency range.

9. The method of claim 1, wherein the first substance and the second substance are two different substances among the water, the fat, and the silica gel.

10. A method for magnetic resonance imaging (MRI), implemented on a computing device having at least one processor and at least one storage device, the method comprising:

obtaining MRI data of a target subject, the MRI data being collected by applying an MRI pulse sequence on the target subject, the MRI pulse sequence including a monomial RF pulse for exciting first substance in the target subject and suppressing second substance in the target subject; and reconstructing a magnetic resonance (MR) image of the target subject based on the MRI data, wherein a first frequency response profile of the first substance with respect to the monomial RF pulse includes one or more passbands in which the first substance is excited, each of the one or more passbands spanning over a locally continuous frequency range, a second frequency response profile of the second substance with respect to the monomial RF pulse includes one or more stopbands in which the second substance is suppressed, at least one stopband of the one or more stopbands being a semi-infinite frequency range, at least one passband of the one or more passbands has an overlap frequency range with the at least one stopband, and a center frequency of the monomial RF pulse is within the overlap frequency range.

11. The method of claim 10, wherein the phase of the monomial RF pulse is a constant value during application.

12. The method of claim 10, wherein a waveform of the monomial RF pulse is determined by:

generating a trapezoidal waveform;

generating a preliminary waveform by performing exponential transformation on each point in the trapezoidal waveform; and determining the waveform of the monomial RF pulse by filtering the preliminary waveform.

13. The method of claim 12, wherein the trapezoidal waveform includes a top side having a first length and a bottom side having a second length, the first length is greater than zero and smaller than the second length.

14. The method of claim 10, wherein a center frequency of the monomial RF pulse is determined by:

determining a duration of the monomial RF pulse and an RF field intensity of the monomial RF pulse;

determining, based on the duration and the RF field intensity, an estimated first frequency response profile of the first substance with respect to the monomial RF pulse and an estimated second frequency response profile of the second substance with respect to the monomial RF pulse; and determining the center frequency of the monomial RF pulse based on the estimated first frequency response profile and the estimated second frequency response profile.

15. The method of claim 14, wherein the estimated first frequency response profile and the estimated second frequency response profile are determined by:

determining peak width information based on the duration;

determining peak frequency information based on the RF field intensity; and determining the estimated first frequency response profile and the estimated second frequency response profile based on the peak width information and the peak frequency information.

16. The method of claim 15, wherein the determining peak frequency information based on the RF field intensity comprises:

determining a threshold intensity relating to the RF field intensity, the threshold intensity corresponding to a preset equivalent flip angle; and determining the peak frequency information based on the RF field intensity and the threshold intensity.

17. The method of claim 14, wherein the determining the center frequency of the monomial RF pulse based on the estimated first frequency response profile and the estimated second frequency response profile comprises:

determining one or more estimated passbands in which the first substance is excited based on the estimated first frequency response profile;

determining one or more estimated stopbands in which the second substance is suppressed based on the estimated second frequency response profile;

determining an estimated overlap frequency range between the one or more estimated passbands and the one or more estimated stopbands; and determining the center frequency that is within the estimated overlap frequency range.

18. The method of claim 10, wherein the first substance and the second substance are two different substances among the water, the fat, and the silica gel.

19. A system for magnetic resonance imaging (MRI), comprising:

at least one storage device including a set of instructions; and at least one processor configured to communicate with the at least one storage device, wherein when executing the set of instructions, the at least one processor is configured to direct the system to perform operations including:

obtaining MRI data of a target subject, the MRI data being collected by applying an MRI pulse sequence on the target subject, the MRI pulse sequence including a monomial radio frequency (RF) pulse for exciting first substance in the target subject and suppressing second substance in the target subject; and reconstructing a magnetic resonance (MR) image of the target subject based on the MRI data, wherein a waveform of the monomial RF pulse is determined by:

generating a trapezoidal waveform;

generating a preliminary waveform by performing exponential transformation on each point in the trapezoidal waveform; and determining the waveform of the monomial RF pulse by filtering the preliminary waveform.

20. The system of claim 19, wherein a first frequency response profile of the first substance with respect to the monomial RF pulse includes one or more passbands in which the first substance is excited, each of the one or more passbands spanning over a locally continuous frequency range, a second frequency response profile of the second substance with respect to the monomial RF pulse includes one or more stopbands in which the second substance is suppressed, at least one stopband of the one or more stopbands being a semi-infinite frequency range, at least one passband of the one or more passbands has an overlap frequency range with the at least one stopband, and a center frequency of the monomial RF pulse is within the overlap frequency range.

* * * * *